United States Patent
Hakey et al.

(10) Patent No.: US 7,026,259 B2
(45) Date of Patent: Apr. 11, 2006

(54) LIQUID-FILLED BALLOONS FOR IMMERSION LITHOGRAPHY

(75) Inventors: Mark C. Hakey, Fairfax, VT (US); David V. Horak, Essex Junction, VT (US); Charles W. Koburger, III, Delmar, NY (US); Peter H. Mitchell, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 10/707,894

(22) Filed: Jan. 21, 2004

(65) Prior Publication Data

US 2005/0158673 A1    Jul. 21, 2005

(51) Int. Cl.
*H01L 21/26* (2006.01)
*G06F 17/50* (2006.01)
*G03B 27/42* (2006.01)

(52) U.S. Cl. .................. 438/795; 430/322; 378/34; 355/76; 438/947

(58) Field of Classification Search ............ 438/795; 355/76; 378/34; 430/5, 116, 322
See application file for complete search history.

(56) References Cited

U.S. PATENT DOCUMENTS

| 5,900,354 | A | 5/1999 | Batchelder | |
|---|---|---|---|---|
| 2002/0101655 | A1 | 8/2002 | Greenwald et al. | |
| 2002/0163629 | A1 | 11/2002 | Switkes et al. | |
| 2005/0036183 | A1* | 2/2005 | Yeo et al. ............ | 359/15 |
| 2005/0037269 | A1* | 2/2005 | Levinson ............ | 430/30 |

FOREIGN PATENT DOCUMENTS

WO    WO 04/093159 A2 * 10/2004

OTHER PUBLICATIONS

M. Switkes et al., "*Immersion Lithography: Optics for the 50 nm Node*" (*Lincoln Lab presentation*), Sep. 4, 2002.
M. LaPedus', news summary for Silicon Strategies, "*ASML, Canon, Nikon take dip into immersion litho*", Feb. 27, 2003.
M. LaPedus', news summary for Silicon Strategies, "*University shows feasibility of immersion lithography*", Feb. 27, 2003.
M. LaPedus', news summary for Silicon Strategies, "*TSMC pursues immersion lithography for IC production*", Apr. 22, 2003.
GEEK.com, article by Sander Olsen "*Immersion lithography could be a godsend to chipmakers*" (*plus attached email comments*), Apr. 22, 2003.

* cited by examiner

Primary Examiner—W. David Coleman
(74) Attorney, Agent, or Firm—Anthony Canale; Greenblum & Bernstein, P.L.C.

(57) ABSTRACT

A liquid-filled balloon may be positioned between a workpiece, such as a semiconductor structure covered with a photoresist, and a lithography light source. The balloon includes a thin membrane that exhibits good optical and physical properties. Liquid contained in the balloon also exhibits good optical properties, including a refractive index higher than that of air. Light from the lithography light source passes through a mask, through a top layer of the balloon membrane, through the contained liquid, through a bottom layer of the balloon membrane, and onto the workpiece where it alters portions of the photoresist. As the liquid has a low absorption and a higher refractive index than air, the liquid-filled balloon system enhances resolution. Thus, the balloon provides optical benefits of liquid immersion without the complications of maintaining a liquid between (and in contact with) a lithographic light source mechanism and workpiece.

21 Claims, 4 Drawing Sheets

LIQUID-FILLED BALLOONS FOR IMMERSION LITHOGRAPHY

BACKGROUND OF INVENTION

1. Field of the Invention

The invention generally relates to immersion lithography for semiconductor fabrication and, more particularly, to a liquid-filled balloon for maintaining a liquid between a photolithographic lens and a wafer.

2. Background Description

A driving force in the continual improvement in complexity and cost of integrated circuits is uninterrupted enhancement of photolithography, particularly the ability to pattern smaller and smaller features. However, optical lithography is rapidly approaching physical barriers that limit the ability to continue scaling down.

Lithography uses radiation to transfer images onto a substrate coated with a material reactive to the radiation. Radiation in the form of light, for example, ultraviolet light, may be directed onto a mask (i.e., a photomask) defining a pattern. After shining through or reflecting from a mask the light is projected through a series of optical lenses and/or mirrors that shrink the image. The reduced image is then projected onto the workpiece. The workpiece may, for example, be a silicon or other semiconductor wafer covered with a radiation-sensitive photoresist. As the projected light hits the photoresist on the silicon wafer, it may alter the unmasked photoresist. Unaltered photoresist may then be chemically washed away, leaving patterned photoresist on portions of the wafer.

The minimum feature (w) that may be printed with a lithography system is determined by the well known Rayleigh equation:

$$W = \frac{k_1 \lambda}{NA} \qquad \text{Equation 1.}$$

where, $k_1$ is the resolution factor, $\lambda$ is the wavelength of the exposing radiation and NA is the numerical aperture.

NA may be determined by the acceptance angle of the lens and the index of refraction of the medium surrounding the lens, as follows:

$$NA = n \sin \alpha = d/(2f) \qquad \text{Equation 2.}$$

where, n is the index of refraction of the medium surrounding the lens and $\alpha$ is the acceptance angle of the lens, d is the lens diameter and f is the focal length. As the sine of any angle is always $\leq 1$ and n=1 (or approximately 1) for air, NA presents a clear physical limit for an air based system. However, a medium with a higher index of refraction than that of air may provide substantial resolution enhancement.

To achieve such enhancement, the medium between the lens and the wafer being exposed must have an index of refraction >1, have low optical absorption at the wavelength of light used for the lithographic process (e.g., a 193 nm wavelength for argon fluoride excimer lasers), be compatible with the photoresist and the lens material, and be uniform and non-contaminating.

For 193 nm exposure wavelength pure water meets all of these requirements, with an index of refraction n≈1.47 and absorption of <5% at working distances of up to 6 mm. Water can also be compatible with photoresist and photolithographic lenses and degassed and decontaminated for a high level of purity. Inserting n=1.47 into equation 2 and assuming sin $\alpha$ is 1, then the resolution limits for 193 nm immersion lithography are as follows:

$$W = \frac{k_1 \lambda}{n \sin \alpha} = \frac{k_1 \times 193 \text{ nm}}{1.47 \times 1.0} = k_1 \times 131.3 \text{ nm} \qquad \text{Equation 3.}$$
$$= 32.8 \text{ nm for } k_1 = 0.25$$

$K_1$=0.25 is considered to be the theoretical minimum value for $k_1$.

This 32.8 nm theoretical resolution represents approximately a 31% improvement over the line width attainable using air, i.e., 48.25 nm with 193 nm lithography.

A number of practical issues to implementing immersion lithography exist. The stage on a lithography exposure tool steps from location to location across the wafer scanning the reticle image for each field. To achieve high throughput, the stage must accelerate rapidly, move accurately to the next field location, settle, scan the image and then step to the next location all in a short period of time. Maintaining a consistent bubble-free liquid between the lens and the wafer is very difficult under these circumstances.

One approach has been to wholly or partially submerge the wafer stage, wafer and lens in a pool of water. The pool may be a recirculating pool or a stagnant pool. An issue with this approach is that submerging significant portions of multi-million dollar equipment requires significant re-engineering.

Another technique is to dispense water between the lens and the wafer with a nozzle. A suction port for liquid recovery may receive supplied liquid. Continuously maintaining a bubble-free even layer of water between the moving lens and wafer can be quite difficult using this technique, and larger topographical discontinuities, such as workpiece edges, complicate the engineering.

The invention is directed to overcoming one or more of the problems as set forth above.

SUMMARY OF INVENTION

In a first aspect of the invention, a photolithographic sub-system adapted for a photolithographic system for projecting light onto a resist covering at least a portion of a substrate is provided. The photolithographic sub-system includes a container having a membrane which has optical properties suitable for light transmission during a lithographic process. A fluid substantially devoid of contaminants is fully contained within the container. The container prevents the fluid from contacting a lens and the resist.

In a second aspect of the invention, another photolithographic system for projecting light onto a resist covering at least a portion of a substrate is provided. The photolithographic system includes a lens and a container that contains a fluid. The container is located between the lens and resist and includes a top layer that is substantially transparent to the light. The container also includes a bottom layer that is substantially transparent to the light and at least one side attaching the top layer to the bottom layer.

In a third aspect of the invention, a method for projecting light through a lens onto a resist covering at least a portion of a substrate is provided. The method entails positioning a container containing a fluid between the lens and resist. The container contacts the lens and resist. Subsequently, light is projected through the lens, through the container containing the fluid and onto the resist. The contained fluid does not contact the lens or the resist.

DETAILED DESCRIPTION

An exemplary embodiment of the invention provides a liquid filled balloon that may be positioned between a workpiece, such as a semiconductor structure covered with a photoresist, and a lithography light source. The term "balloon" as used herein means a container for a fluid, whether or not the container is inflatable or otherwise expandable. The exemplary balloon includes a thin pliable membrane that exhibits good optical and physical properties. Liquid contained in the balloon also exhibits good optical properties, including a refractive index higher than that of air. Light from the lithography light source passes through a mask, through lens assembly, through a top layer of the balloon membrane, through the contained liquid, through a bottom layer of the balloon membrane, and onto the workpiece where it alters portions of the photoresist. As the liquid has a low absorption and a higher refractive index than air, the liquid-balloon system enhances resolution. Thus, the balloon provides optical benefits of liquid immersion without the complications of maintaining a liquid between (and in contact with) a lithographic light source mechanism and work piece.

Figure 1A:
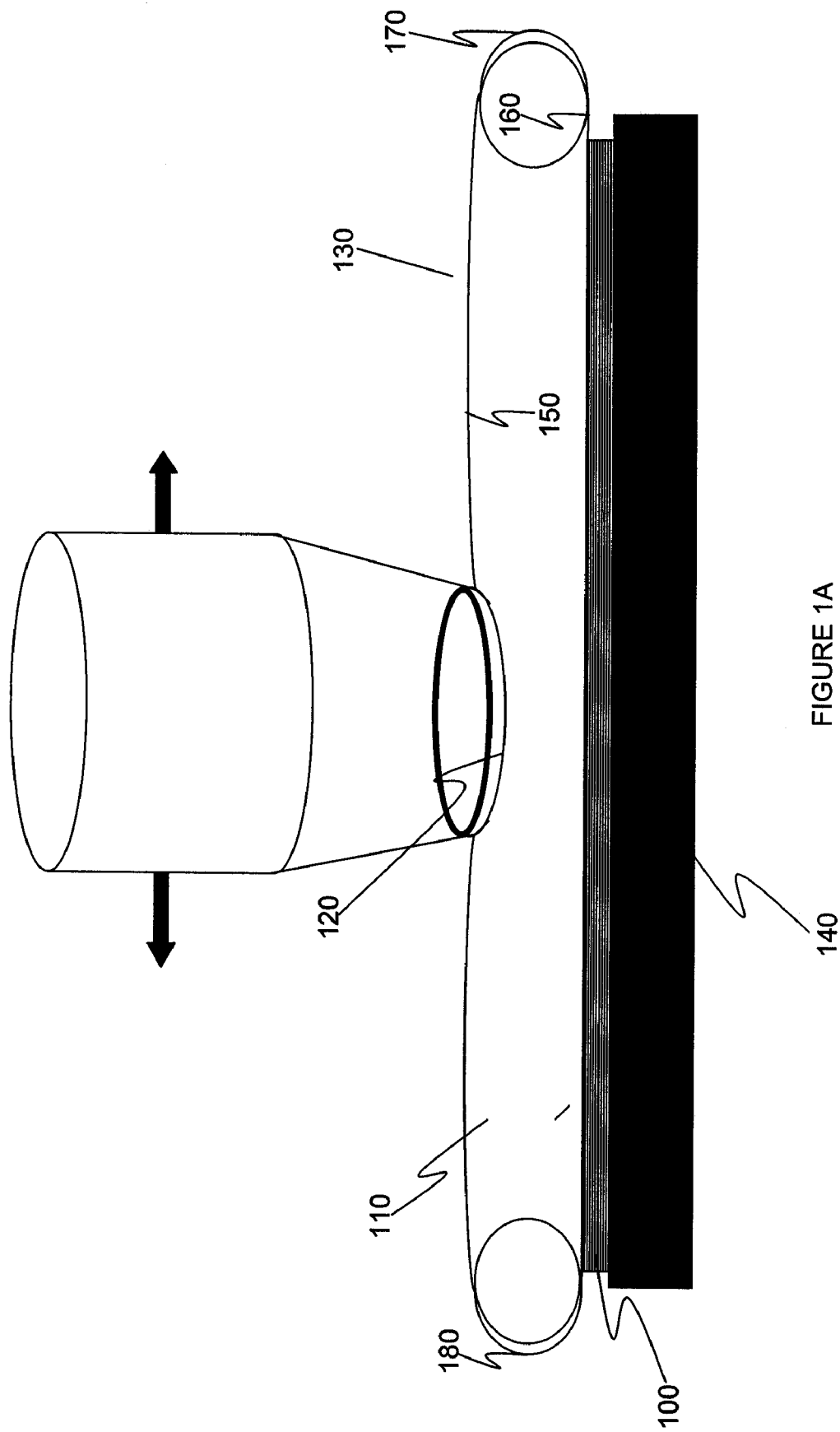
FIG. 1a shows a balloon or container used in accordance with the principles of the invention.

Referring now to FIG. 1a, an exemplary balloon 130 in accordance with the principles of the invention is shown. The balloon 130 is positioned between a workpiece 100 and a lithographic light source assembly 120, referred to herein as a lens assembly. A support 140, supports the workpiece 100. The workpiece 100 may be a semiconductor structure covered with a photoresist. The lens assembly 120 and/or the support 140 may be movable along one or more axes. For example, the lens assembly may scan across the workpiece field. A mask (not shown) between the light source and the lens assembly 120 defines a pattern to be cured in the photoresist.

Except for the balloon 130, the aforementioned features are typical of conventional lithography systems. The arrangement of features described above is intended to represent a broad category of lithography systems that may benefit from having a liquid with a high refractive index and low absorption being positioned between the light source and workpiece. The invention is not limited to the lithography system described above. Other lithography systems, now known or hereafter developed, that may accommodate a liquid-filled balloon between the workpiece and light source may be used without departing from the scope of the invention.

The exemplary balloon 130 may be comprised of a thin membrane, including a top membrane layer 150 and a bottom membrane layer 160. Sides 170 and 180, as shown in the two-dimensional view of FIG. 1, adjoin the top membrane layer 150 to the bottom membrane layer 160. Together the top and bottom membranes 150 and 160, as adjoined by the sides 170 and 180, form a container for a liquid 110 that is suitable for immersion lithography.

The top membrane layer 150 and bottom membrane layer 160 are comprised of a material that does not materially interfere with the lithography process. The material should be thin, exhibit good light transmission (i.e., low absorption) at the wavelength used for the lithographic process, and exhibit good physical properties.

Referring still to FIG. 1a, the balloon may be sized to cover the workpiece 100, e.g., a semiconductor substrate coated with photoresist, and to occupy the space between a lithographic lens assembly 120 and the workpiece 100. Any air gap, such as a gap between the lens assembly 120 and top layer 150 of the balloon 130, would reduce the overall effectiveness of the balloon 130 in enhancing resolution. While a small balloon, such as a balloon covering a single stepping field, also comes within the scope of the invention, such a balloon must be repositioned between fields consuming resources and increasing the risk of defects.

Figure 1B:
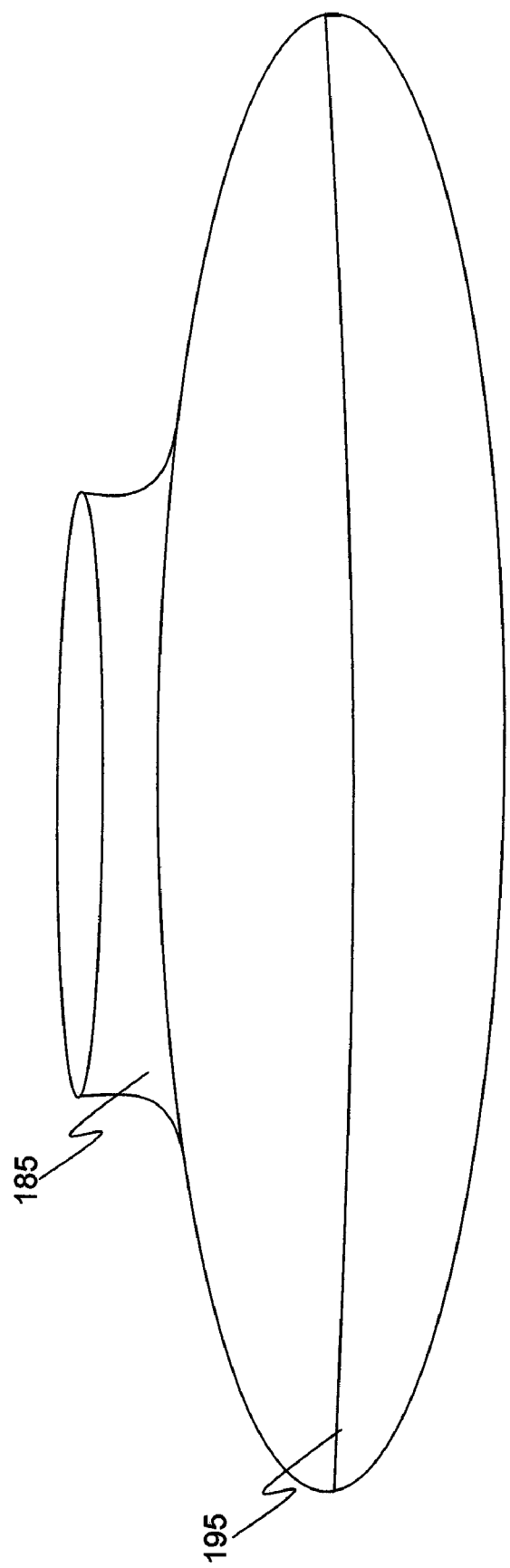
FIG. 1b shows a container used in accordance with the principles of the invention.
Figure 2:
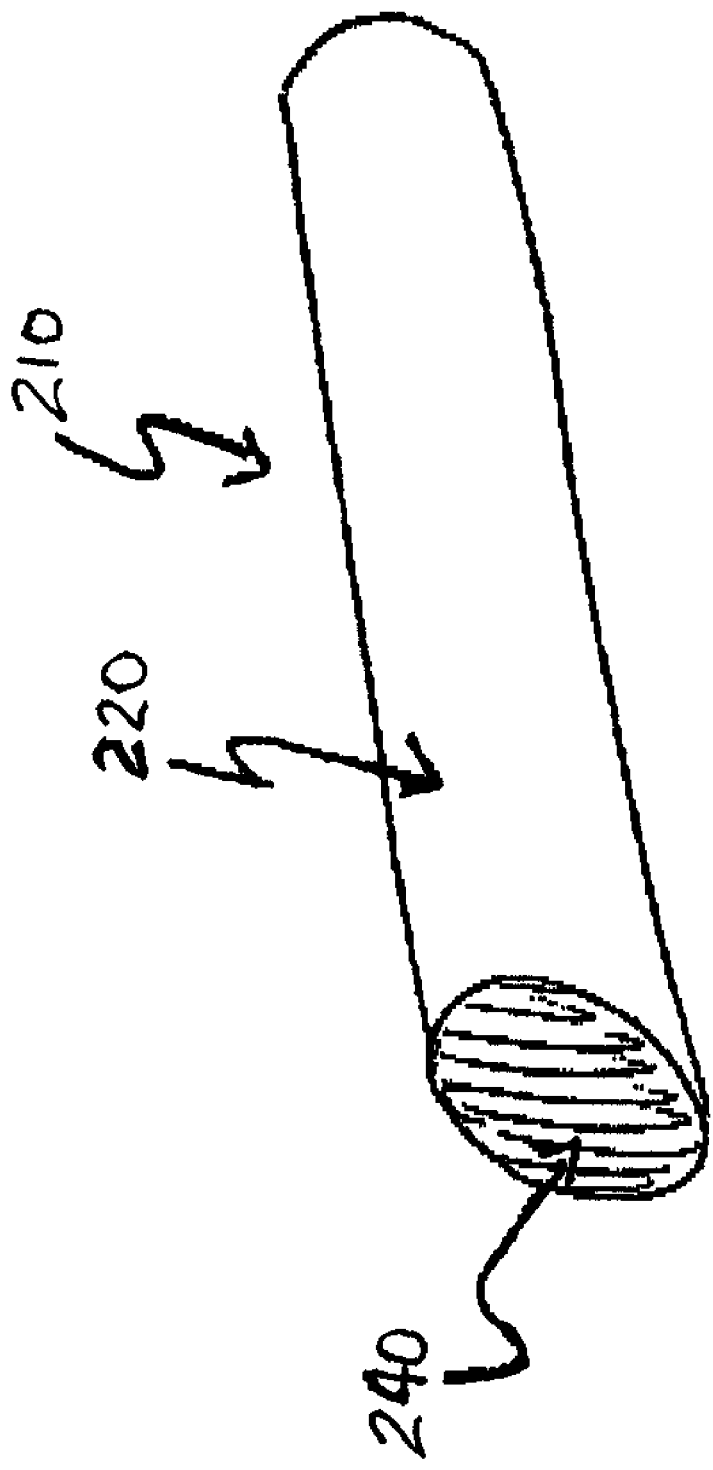
FIG. 2 shows a container used in accordance with the principles of the invention.

The balloon may be of various shapes. For example, a pillow shape as shown in FIG. 1, a cylindrical shape as shown in FIG. 2, or other three-dimensional shapes may be used without departing from the scope of the invention. In one embodiment, the shape of the top layer 150 is arcuate and conforms to the shape of the lens element of the lens assembly 120 in contact with the balloon 130. The bottom layer 160 may be shaped to conform to the workpiece surface.

Additionally, the balloon may be equipped with additional features. For example, the balloon may have a collar or rim 185 for securing it to a lens assembly, a workpiece, or a support for the workpiece, as shown in FIG. 1b. Additionally, the balloon may have markings or other indicia for properly positioning and using the balloon.

The sides of the balloon may be comprised of the same material as the top and bottom layers, or of different materials. As light will not be directed through the sides, the optical properties of the sides are not as important. Consequently, as conceptually shown in FIG. 1, a balloon 130 according to the principles of the invention may have opaque sides 170 and 180, so long as the top layer 150 and bottom layer (160) have optical properties suitable for light transmission during the lithographic process. Of course, the sides 170 and 180, in combination with the top layer 150 and bottom layer, must be able to contain the lithographic liquid.

Additionally, the sides may be pliable (or compliant) to allow the lens assembly to scan across the top layer of the balloon without appreciable resistance. Sides capable of readily stretching or flexing approximately 1 to 3 cm in any direction are considered sufficiently compliant for use in connection with conventional lithography equipment. A balloon (or container) capable of readily stretching or flexing approximately 1 to 3 cm in any direction without materially interfering with photolithography scanning is considered compliant.

Materials employed for top and bottom layers of the balloon must be sufficiently pliant to conform to curvature and irregularities present in the surfaces of the workpiece 100 and bottom of lens assembly 120. Having an index of refraction close to that of the fluid contained within the balloon will ease thickness control issues.

By way of example and not limitation, the top and bottom layers of a balloon according to the principles of the invention may be comprised of an amorphous fluoropolymer, such as Teflon® AF by E.I. duPont de Nemours and Company. Teflon® AF provides good optical clarity and mechanical properties, including strength. In particular, Teflon® AF possesses good light transmission from the deep ultraviolet range through and including a significant portion of the infrared range, with less than approximately 20% absorption of light at 193 nm. Teflon® AF also has a refractive index greater than 1, approximately 1.290 to 1.315, depending upon the specific processing.

Additionally, Teflon® AF may be cast into thin-films or applied using conventional spin, spray, brush, or dipping techniques. Teflon® AF may also be molded at relatively low temperatures by extrusion, pressing, or injection molding, in conventional fluoropolymer molding equipment. Any seams 195 created in the balloon manufacturing process may be located at the sides so as to not interfere with the lithography process.

Another example of a suitable material for top and bottom layers of a balloon according to the principles of the invention is Clariflex™ (available from Westlake Plastics Company of Lenni, Pa.), a transparent fluorplastic comprised of tetrafluoroethylene, hexafluoropropoylene, and vinylidene fluoride. Clariflex™ exhibits a refractive index of approximately 1.355 and absorption of less than approximately 5% at 248 nm and 365 nm wavelengths.

Fluid contained within the balloon should have a higher index of refraction than that of air. The contained fluid should also not absorb substantial percentages of transmitted light. As any bubbles, impurities or other contaminants could introduce defects into the lithography process, the contained fluid should be as pure, bubble-free, and contaminant-free as reasonably possible. An example of a suitable fluid for 193 nm wavelength light is pure water and/or pure deionized water.

Other examples of suitable fluids are liquids based on perfluoropolyethers (PFPE) which are sufficiently transparent for a working wavelength of 157 nm. PFPEs generally exhibit refractive indexes between approximately 1.30 to 1.40. Representative PFPEs are known by the brand names Demnum® (Daikin Kogyo Co., Ltd., Japan), Krytox® (DuPont Specialty Chemicals, Deepwater, N.J.), and Fomblin® Z (Zentek SRL, Milan, Italy).

Figure 3:
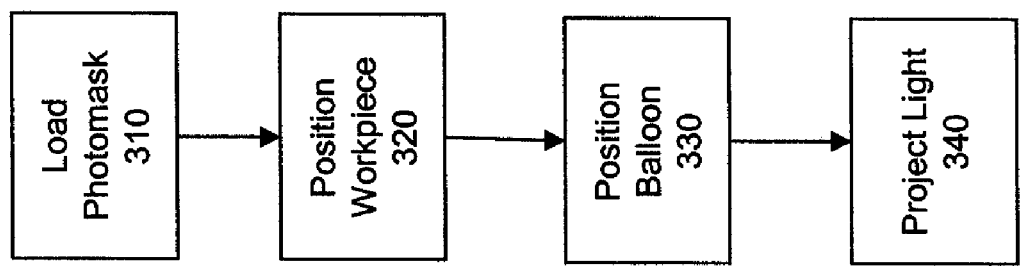
FIG. 3 shows a flowchart of a methodology for projecting light through a lens, through a container containing a fluid, and onto a resist in accordance with the principles of the invention.

Referring now to FIG. 3, a high-level flowchart of steps of a methodology according to the principles of the invention is shown. The methodology entails loading a photomask into lithography equipment in a conventional manner, as in step 310. The photomask defines a pattern corresponding to photoresist on a semiconductor structure which will react with light from the lithography process. A workpiece, i.e., the semiconductor structure covered in whole or in part by the photoresist, is also loaded into the lithography equipment in a conventional manner, as in step 320. After the workpiece is properly positioned, a balloon containing a fluid according to the principles of the invention is positioned between the last lens of the lithography equipment and the workpiece, as in step 330. The balloon is positioned in contact with the top surface of the workpiece and the lens. After positioning the balloon, light may be projected through the lens of the lithography equipment, through a first surface of the balloon, through the contained fluid, through a second surface of the balloon and onto the workpiece, as in step 340.

Some of steps of the methodology may be performed in an order other than as shown in the flowchart of FIG. 3. For example, steps 310 and 320 may be performed in an order other than as shown in the flowchart.

Advantageously, the fluid contained in the balloon does not directly contact the workpiece or the lens assembly. Thus, adverse effects otherwise caused by the liquid contacting the lens assembly and workpiece are avoided. Consequently, the invention enables use of liquids with suitable optical qualities irrespective of how the liquid might react with a lens assembly, other components of a lithography system or the workpiece. Thus, the invention expands the range of acceptable liquids for use in enhancing lithographic resolution.

Also, the invention facilitates disposal of the liquid. The balloon with contained liquid may be cleaned and reused. Alternatively the contained liquid may be removed and recycled for use in new balloons. Otherwise, the liquid may be properly and safely discarded, without requiring elaborate plumbing.

While the invention has been described in terms of exemplary embodiments, those skilled in the art will recognize that the invention can be practiced with modifications and in the spirit and scope of the appended claims.

The invention claimed is:

1. A photolithographic sub system adapted for use in a photolithographic system for projecting light onto a resist covering at least a portion of a substrate, the photolithographic sub system comprising:
    a container having a membrane which has optical properties suitable for light transmission during a lithographic process; and
    fluid substantially devoid of contaminants, the fluid being fully contained within the container such that the container prevents the fluid from contacting a lens and the resist.

2. A photolithographic sub system according to claim 1, wherein the container includes:
    a top layer that is substantially transparent to light; and
    a bottom layer that is substantially transparent to the light.

3. A photolithographic sub system according to claim 2, wherein:
    the top layer has an absorption of less than about twenty percent of the light; and
    the bottom layer has an absorption of less than about twenty percent of the light.

4. A photolithographic sub system according to claim 2, wherein the container is a fluid-sealed bag.

5. A photolithographic sub system according to claim 1, wherein the container is a compliant container.

6. A photolithographic sub system according to claim 1, wherein the fluid is a liquid having a refractive index greater than the refractive index of air.

7. A photolithographic sub system according to claim 1, wherein the container is shaped as one of a pillow shape and a cylindrical shape.

8. A photolithographic sub system according to claim 1, wherein the fluid is substantially transparent to the light.

9. A photolithographic sub system according to claim 8, wherein the fluid is a liquid having an absorption of less than about twenty percent of the light.

10. A photolithographic sub system according to claim 1, wherein the fluid is comprised of water, deionized water, or a liquid based on perfluoropolyether (PFPE).

11. A photolithographic sub system according to claim 2, wherein the top layer and the bottom layer are comprised of one of an amorphous fluoropolymer and a fluorplastic comprised of tetrafluoroethylene, hexafluoropropylene, and vinylidene fluoride.

12. A photolithographic sub system according to claim 1, wherein the fluid is a purified fluid.

13. A photolithographic sub system according to claim 1, wherein the container includes a collar which conforms to a lens of the photolithographic system.

14. A photolithographic sub system according to claim 1, wherein the container includes:
- a top layer;
- a bottom layer; and
- a seam defining a junction of the top layer to the bottom layer; the seam being located around a periphery of the container so as to not interfere with light transmitted through the top layer and the bottom layer.

15. A photolithographic system according to claim 2, wherein
- the bottom layer is sized to cover at least a portion of the resist; and
- the top layer is shaped to the contour of the lens.

16. A photolithographic system for projecting light onto a resist covering at least a portion of a substrate, the photolithographic system comprising:
- a lens;
- a container containing a fluid, the container being located between the lens and resist and comprising:
- a top layer that is substantially transparent to the light;
- a bottom layer that is substantially transparent to the light; and
- at least one side attaching the top layer to the bottom layer.

17. A photolithographic system according to claim 16, wherein:
- the top layer, the bottom layer and the at least one side are comprised of the same material.

18. A photolithographic system according to claim 16, wherein:
- the top layer has an absorption of less than about twenty percent of the light and a refractive index greater than 1;
- the bottom layer has an absorption of less than about twenty percent of the light and a refractive index greater than 1; and
- the at least one side has an absorption different from the absorption of the top layer and the bottom layer and a refractive index different from the refractive index of the top layer and the bottom layer.

19. A photolithographic system according to claim 18, wherein the fluid is a liquid having:
- a refractive index greater than the refractive index of air; and
- substantial transparency to light.

20. A method for projecting light through a lens onto a resist covering at least a portion of a substrate, the method comprising steps of:
- positioning a container containing a fluid between and in contact with the lens and resist; and
- projecting light through the lens, through the container containing the fluid and onto the resist, whereby the contained fluid does not contact the lens or resist.

21. A method for projecting light through a lens onto a resist according to claim 20, wherein
- the container includes a top layer that is substantially transparent to the light and a bottom layer that is substantially transparent to the light; and
- the step of projecting light through the lens, through the container containing the fluid and onto the resist, includes projecting light through the lens, then through the top layer of the container, then through the fluid contained within the container, then through the bottom layer of the container, then onto the resist.

* * * * *